United States Patent [19]

Satoh

[11] Patent Number: 5,093,697
[45] Date of Patent: Mar. 3, 1992

[54] SEMICONDUCTOR LIGHT EMITTING ELEMENT

[75] Inventor: Shiro Satoh, Miyagi, Japan

[73] Assignees: Ricoh Company, Ltd., Tokyo; Ricoh Research Institute of General Electronics Co., Natori, both of Japan

[21] Appl. No.: 603,562

[22] Filed: Oct. 26, 1990

[30] Foreign Application Priority Data

Oct. 30, 1989 [JP] Japan .................................. 1-282760

[51] Int. Cl.⁵ .................................. H01L 33/00
[52] U.S. Cl. .................................. 357/17; 357/16; 357/71; 357/45; 372/48; 372/50; 372/46; 372/45
[58] Field of Search ........................ 357/17, 16, 45, 71, 357/68; 372/43, 44, 45, 46, 47, 48, 49, 50

[56] References Cited

U.S. PATENT DOCUMENTS

| | | | |
|---|---|---|---|
| 3,962,714 | 6/1976 | King | 372/50 X |
| 4,212,020 | 7/1980 | Yariv et al. | 372/50 X |
| 4,318,059 | 3/1982 | Lang et al. | 372/50 X |
| 4,607,370 | 8/1986 | Mukai et al. | 372/50 |
| 4,791,636 | 12/1988 | Yamamoto et al. | 372/44 X |

FOREIGN PATENT DOCUMENTS 61-66190 7/1986 Japan .................................. 372/50 X Primary Examiner—William Mintel
Attorney, Agent, or Firm—Oblon, Spivak, McClelland, Maier & Neustadt

[57] ABSTRACT

A semiconductor light emitting element that includes a substrate having an upper surface, a multi-layered semiconductor stacked structure formed on the upper surface of the substrate. The multi-layered stacked structure emits light when a current is applied and passes through the structure. The element further includes a first electrode disposed on the multi-layered stacked structure and a second electrode disposed aside the multi-layered stacked structure on the upper surface of the substrate. The second electrode constitutes a counter electrode for the first electrode.

16 Claims, 6 Drawing Sheets

SEMICONDUCTOR LIGHT EMITTING ELEMENT

BACKGROUND OF THE INVENTION

1. Field of the Invention

The present invention relates to the structure of a semiconductor light emitting element and an array structure of the light emitting elements.

2. Description of the Related Art

A semiconductor light emitting element array is composed of an assembly of a plurality of LDs (Laser Diodes) or LEDs (Light Emitting Diodes) and used as an optical source for a writing head of a laser printer, for instance.

A typical monolithic structure of the semiconductor light emitting element is disclosed in Japanese Laid Open Patent Application (KOKAI) Nos. 60-90784, 60-99673 and 60-116479.

The array structure disclosed in the above-mentioned patent documents comprises a pair of electrodes for applying an electric voltage which are arranged in such a way that one of the electrodes is disposed on an upper surface of a substrate and the other is disposed on a lower surface of the substrate.

Such a structure does not have any significant problems in the event that the lower side electrode is used as a common counter electrode for all of the selective electrodes which are formed on the upper surface of the substrate separately from each other.

However, in the event that the lower electrode is to be divided to a plurality of counter electrodes for upper side electrodes, the lower counter electrodes have to be patterned strictly corresponding to the upper electrodes. Patterning the lower electrodes corresponding to the upper electrodes requires a high and troublesome techniques of a double-exposure patterning process, which limits the pattern density of the lower electrodes and also restricts the optical elements which can be combined with the array structure.

SUMMARY OF THE INVENTION

The present invention was made considering the above-mentioned point.

It is therefore an object of the present invention to provide a semiconductor light emitting element which makes it possible to realize an array structure which comprises electrodes and counter electrodes that can be easily patterned strictly corresponding to each other, each electrode being sufficiently minute, and makes it possible to widen the kind of the optical elements that can be combined with the array structure.

The above-mentioned object of the present invention can be achieved by a semiconductor light emitting element comprising:

a substrate having an upper surface;

a multi-layered semiconductor stacked structure formed on the upper surface of the substrate, the stacked structure emitting light when a current is applied thereto;

a first electrode disposed on the multi-layered stacked structure; and a second electrode disposed aside the multi-layered stacked structure on the upper surface of the substrate, the second electrode constituting a counter electrode for the first electrode.

Advantages of the above-mentioned semiconductor light emitting element are that, in the event of constituting a light emitting array structure, the electrode patterns can be easily formed and the individual multi-layered semiconductor elements are reliably separated from each other electrically.

Further objects and advantages of the present invention will be apparent from the following description of the preferred embodiments of the invention as illustrated in the accompanying drawings.

BRIEF DESCRIPTION OF THE DRAWINGS

FIG. 7b is a sectional view of the array structure along the line b—b of FIG. 7a;

FIG. 7c is a sectional view of the array structure along the line c—c of FIG. 7a;

FIG. 7d is a sectional view of the array structure along the line d—d of FIG. 7a;

FIG. 8b is a sectional view of the array structure along the line b—b of FIG. 8a.

DESCRIPTION OF THE PREFERRED EMBODIMENTS

Embodiments of the present invention are described hereinafter with reference to the drawings.

Figure 1:
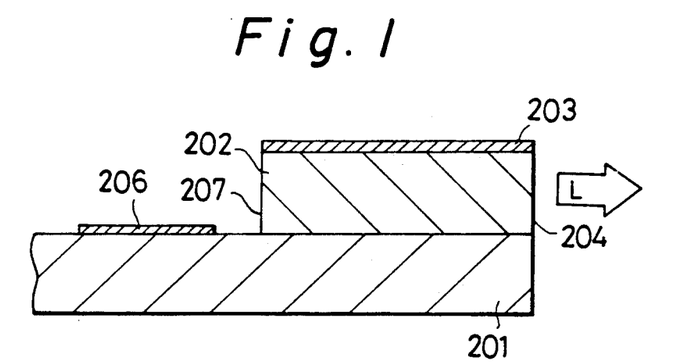
FIG. 1 is an essential constructional view representing a section of the semiconductor light emitting element in accordance with an embodiment of the present invention.

FIG. 1 illustrates an essential construction of the semiconductor light emitting element in accordance with an embodiment of the present invention.

The construction is composed of a substrate 201, a multi-layered semiconductor stacked structure 202, a first electrode 203 and a second electrode 206.

The substrate 201 is constituted from a semiconductor material such as GaAs in this particular embodiment.

The stacked structure 202 is formed on the upper surface side of the substrate 201 and comprises layers made from one or more of semiconductor materials such as GaAs, AlGaAs and AlAs. Each layer is formed in parallel with the substrate surface. Junctions are arranged in the structure 202 so as to emit light when a voltage is applied.

The structure 202 has a longitudinal rectangular shape when seen from an upper side. A right end surface 204 is arranged as a light emitting end surface being perpendicular to the longitudinal direction of the structure 202. The end surface 204 accordingly is perpendicular to the surface of the substrate 201.

With respect to the left end surface 207 opposite to the surface 204, the surface 207 is formed in parallel to the surface 204 in the event that the structure is arranged to function as a semiconductor laser source. However, in the event that the structure is arranged to function as a light emitting diode (LED), it is not necessary to form the surface 207 in parallel to the surface 204.

The first electrode 203 is formed on the upper surface of the structure 202 and has a longitudinal rectangular shape when seen from the upper side thereof.

The second electrode 206 is formed on the surface of the substrate 201 in a different location from that of the structure 202.

An electric current can pass from the electrode 203 through the structure 202 and the substrate 201 to the other electrode 206, or vice versa.

The electrodes 203 and 206 are desirably made from a metal which can be arranged as an ohmic contact. For example, when the electrode material implantation side layer of the structure 202 being in contact with the electrode 203 is made of P-type semiconductor, the electrode 203 is made from a metal such as Au or Au-Zn. In this case, the substrate 201 is made from a material of N-type and the electrode 206 is made from a metal such as Au or Au-Ge-Ni.

On the other hand, in the event that the implantation side layer of the structure 202 being in contact with the electrode 203 is made of N-type semiconductor while the substrate 201 is made of P-type material, the electrode 203 may be made from a metal such as Au or Au-Ge-Ni and the electrode 206 may be made from a metal such as Au or Au-Zn.

When a current is applied to the structure 202 through the electrodes 203 and 206, light is generated in the junction portion within the structure 202 and emitted from the end surface 204 in the direction perpendicular to the surface 204 as designated by an arrow L in FIG. 1.

The above-mentioned semiconductor light emitting element is produced in such a way described as follows.

First, a semiconductor multi-layered structure is stacked over a sufficiently wide area on the substrate 201 by a film forming process such as LPE, MOCVD or MBE. After that, the multi-layered stacked structure 202 is defined by removing the unnecessary outside area of the structure 202 by a dry-etching process using a chlorine group gas. After that, the electrodes 203 and 206 are deposited on the substrate 201 and structure 202, respectively, by an evaporation process.

Figure 2:
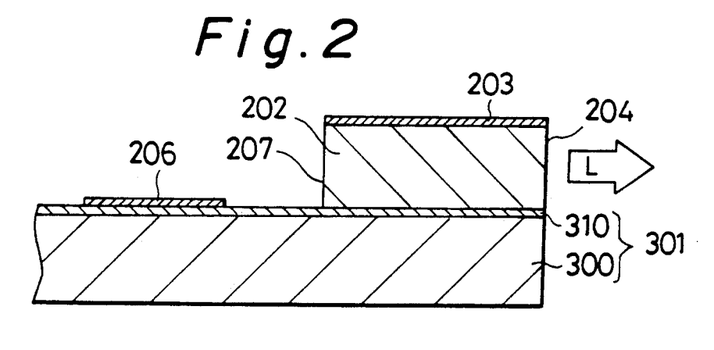
FIG. 2 is an essential constructional view representing a section of the semiconductor light emitting element in accordance with another embodiment of the present invention.

FIG. 2 illustrates an essential structure of another embodiment of the present invention.

In FIG. 2, numeral 301 designates a substrate. Numerals 202, 203 and 206 designate the multi-layered semiconductor stacked structure, the first electrode and the second electrode, respectively, as in the case of the embodiment of FIG. 1. Also, the end surfaces 204 and 207 and the emitting light L are arranged in the same way as those of FIG. 1.

The substrate 301 has a semiconductor layer 310 for passing current formed on the upper surface side thereof. In this particular embodiment, the substrate 301 comprises a semiconductor plate 300 made from GaAs and the current passing layer 310 made from GaAs or AlGaAs formed as a single layer or a multi-layered structure.

The electrodes 203 and 206 are made from a metal having an ohmic contact characteristic, as in the case of the structure of FIG. 1.

If the implantation side semiconductor layer of the stacked structure 202 being in contact with the electrode 203 is made of a P-type material, the electrode 203 may be made from a metal such as Au or Au-Zn. In this case, the semiconductor layer 310 is made from an N-type material and the electrode 206 is made from a metal such as Au or Au-Ge-Ni.

On the other hand, if the implantation side semiconductor layer of the stacked structure 202 being in contact with the electrode 203 is made of an N-type material while the layer 310 is made of a P-type material, the electrode 203 may be made from a metal such as Au or Au-Ge-Ni while the electrode 206 may be made from a metal such as Au or Au-Zn.

The substrate 301 is arranged in such a way that the plate 300 is made from a high resistance material while the layer 310 is made from a low resistance N-type or P-type material. By such an arrangement, when a current is applied to the substrate, the current passes only through the upper layer 310.

Accordingly, in the event that a semiconductor light emitting element array is constituted from the elements having the structure of FIG. 2 disposed in a monolithic array arrangement wherein the substrate 301 is used as a common substrate, it becomes possible to reliably insulate the elements or element groups electrically from each other by electrically dividing the layer 310 by an insulating material.

The layer 310 may be divided either by forming a separation groove constituting an insulation area by a dry-etching process using a chlorine group gas or by forming an insulation area for dividing the layer 310 by a thermal diffusion of impurities or ion implantation process of impurities. In the event that the impurities are to be implanted, Si or Sn may be used as the impurities for the N-type layer while Zn may be used as the impurities for the P-type layer.

The layer 310 may be formed in such a way that the layer is selectively deposited on the plate 300 by an LPE process or an MOCVD process so that the separating grooves are formed between the deposited layers.

In the event that the layer 310 is made from a low resistance N-type material while the plate 300 is made from a P-type material, a third electrode may be arranged on the lower surface of the plate 300 or in an area on the upper surface of the substrate where the plate 300 is exposed. The potential of the third electrode is arranged to be lower than that of the electrode 206. By such an arrangement, an inverse bias voltage is generated between the layer 310 and the plate 300, which prevents the leakage of the current to the plate 300 so that the above-mentioned electric division can be more reliably achieved.

On the other hand, in the event that the layer 310 is made from a low resistance P-type material while the plate 300 is made from an N-type material, the potential of the third electrode is arranged to be higher than that of the electrode 206. By such an arrangement, it becomes possible to reliably insulate the elements or element groups of the array structure as mentioned above.

Also, in the event that the substrate comprises an N-type semiconductor plate 300 and the layer 310 composed of a P-type layer and an N-type layer stacked on the plate 300 in this order, it becomes possible to reliably divide the array structure electrically by arranging the potential of the third electrode higher than that of the electrode 206.

Similarly, in the event that the plate 300 is made from a P-type material and the layer 310 is composed of an N-type layer and a P-type layer stacked on the plate 300 in this order, it becomes possible to reliably divide the array structure electrically by arranging the potential of the third electrode lower than that of the electrode 206.

Further concrete examples of the above-mentioned essential structures of FIGS. 1 and 2 are described hereinafter with reference to FIGS. 3a to 3e and FIG. 4.

Figure 3A:
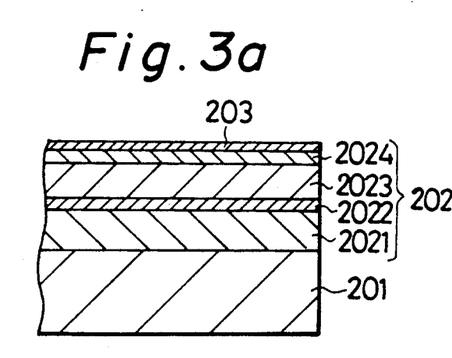
FIGS. 3a to 3e are sectional views of concrete different examples, respectively, of the essential structure of FIGS. 1 or 2.

FIG. 3a illustrates an example of the structure of FIG. 1.

On an N-type GaAs substrate 201 is formed a multi-layered semiconductor stacked structure 202 composed of an N-type AlGaAs clad layer 2021, a GaAs or AlGaAs active layer 2022, a P-type AlGaAs clad layer 2023 and a P-type GaAs electrode layer 2024 stacked in this order. On the layer 2024 is formed the first electrode 203. As can be seen from the description, the structure 202 is formed as a double-hetero structure. The forbidden band of each clad layer is larger than that of the active layer.

When a current is applied between the electrode 203 and the second electrode (not shown), the current runs through the structure in the vertical direction in FIG. 3a so that the carriers are recombined in the active layer 2022 and light is generated thereby. The light is emitted from a side end surface of the structure.

In the event that the conductive type of each layer of the stacked structure 202 is arranged opposite to that of the above-mentioned arrangement, the conductive type of the substrate 201 is reversed, accordingly.

Figure 3B:
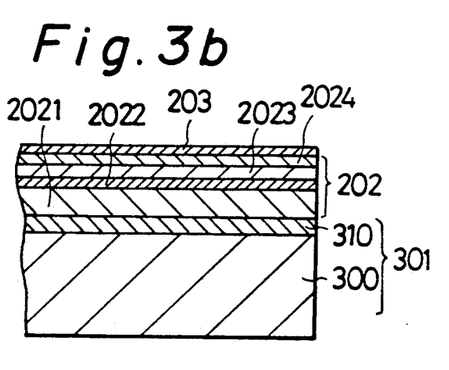

FIG. 3b illustrates a concrete example of the essential structure of FIG. 2.

The substrate 301 comprises a semiconductor plate 300 and a current passing semiconductor layer 310. The multi-layered structure 202 and the electrode 203 are formed in the same arrangement as those of FIG. 3a.

In the event that the plate 300 is made from a high resistance or P-type GaAs material, the layer 310 may be made from a low resistant N-type GaAs material.

On the other hand, in the event that the plate 300 is made from an N-type GaAs material, the layer 310 is arranged being composed of an N-type GaAs layer and a P-type GaAs or AlGaAs layer wherein the N-type GaAs layer is disposed in contact with the substrate surface.

When the conductivity of each layer of the layered structure 202 is opposite to that of the examples mentioned above, the conductivity of the plate 300 and the layer 310 are reversed from those of the examples.

Figure 3C:
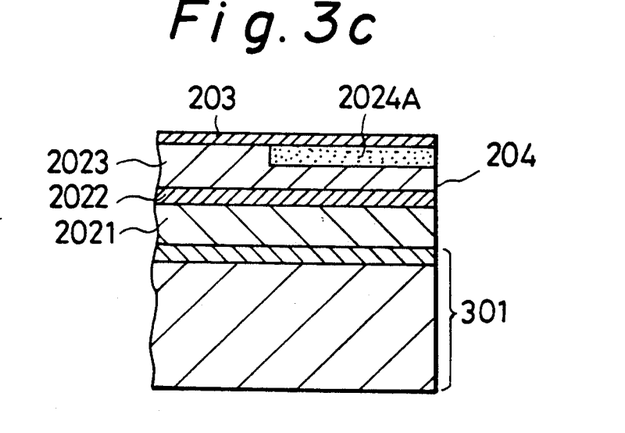
Figure 3D:
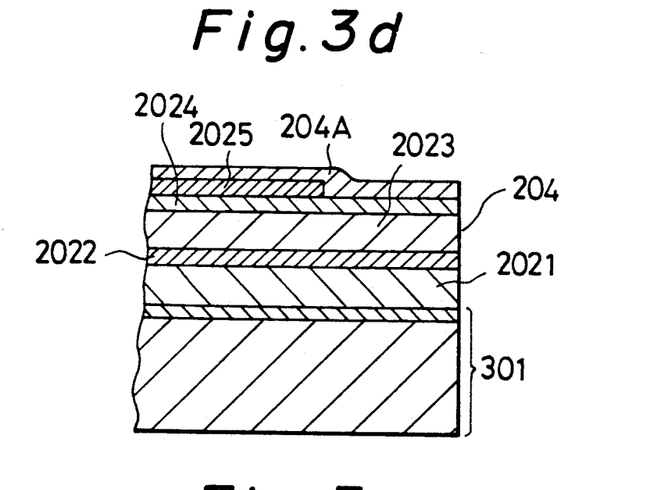
Figure 3E:
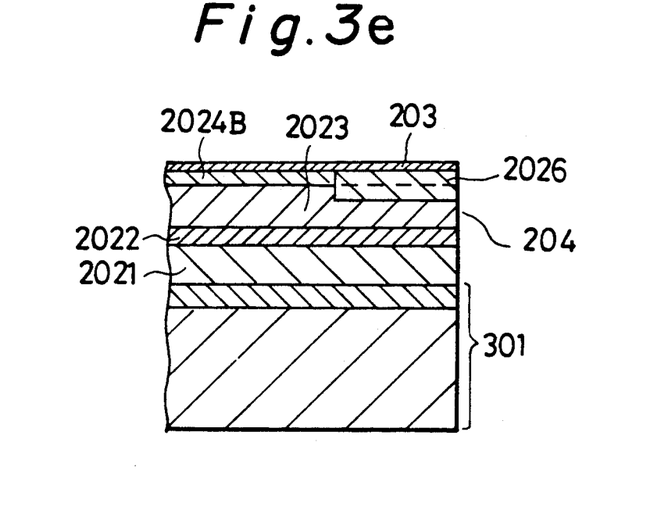

FIGS. 3c, 3d and 3e illustrate another examples of the essential structure of the present invention. These examples are variants of the structure of FIG. 2. However, they are also applicable to the structure of FIG. 1 as well.

Corresponding parts of the structures of FIGS. 3c to 3e are designated by the same numerals as those of FIG. 3b.

A feature of the example of FIG. 3c resides in that the layer 2024A is partly disposed below the first electrode 203 in contact therewith instead of being disposed along the entire length of the electrode 203 as the layer 2024 of FIG. 3b. The layer 2024A has a predetermined length from the end surface 204 along the longitudinal direction of the structure. The layer 2024A is formed, for instance, by diffusing Zn in the P-type AlGaAs clad layer 2023 to lower the resistance thereof.

In accordance with the construction of FIG. 3c, when used as an LED, the current can be applied to the portion of predetermined length from the end surface 204. Therefore, by adjusting the length of the layer 2024A, it becomes possible to raise the output of light emission by minimizing the loss of light due to the absorption of the light in the structure. Such an effect of the structure is also obtained by the structure of FIGS. 3d or 3e as well.

FIG. 3d illustrates a construction in which an electrically insulating layer 2025 is partly formed on the layer 2024 without the portion of a predetermined length from the end surface 204. The layer 2025 is made from, for instance, silicon oxide or silicon nitride. The electrode 204A comes in contact with the layer 2024 only in the area not covered with the layer 2025.

FIG. 3e illustrates another example of the semiconductor light emitting element construction in accordance with the present invention.

In this example, an N-type GaAs or AlGaAs layer 2024B is formed on the P-type AlGaAs clad layer 2023 wherein a low resistant area 2026 is formed by diffusing Zn reaching the clad layer 2023 in the portion of a predetermined length from the end surface 204.

In accordance with the structure of FIG. 3e, since an inverse bias voltage is applied to the structure in the portion other than the area 2026, the current is applied only to the portion of the area 2026 from the electrode 203, which makes it possible to raise the optical emission efficiency.

Figures 4, 5:
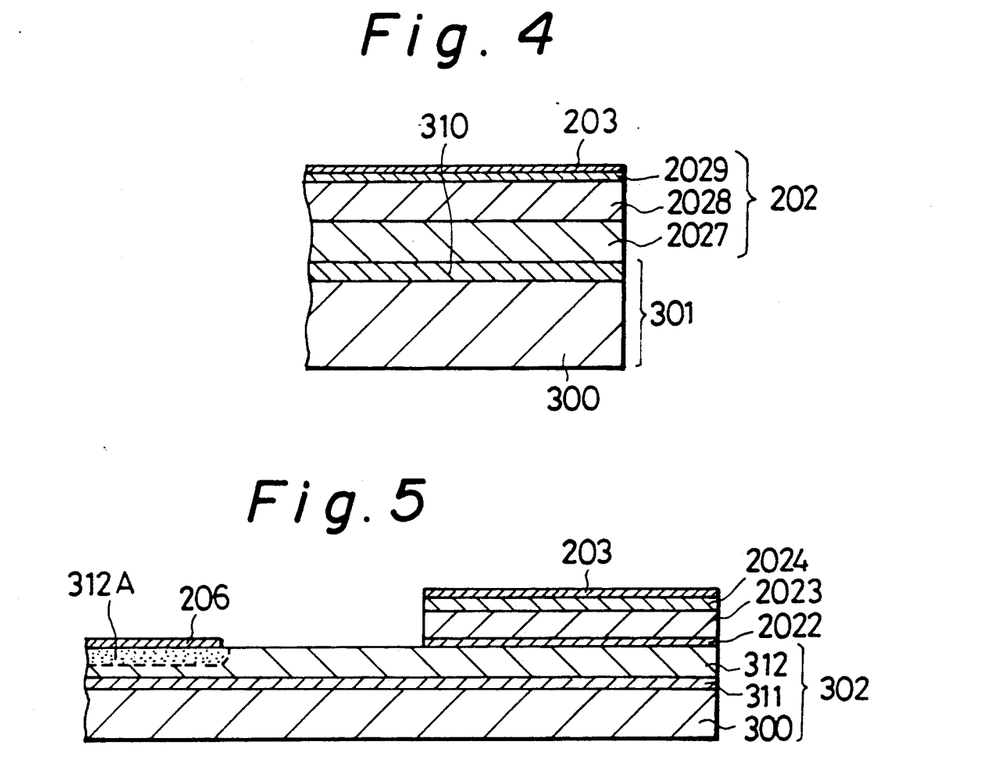
FIG. 4 is a sectional view of another embodiment of the present invention.
FIG. 5 is a sectional view of still another embodiment of the present invention.

FIG. 4 illustrates another embodiment of the semiconductor light emitting element in accordance with the present invention in which the multi-layered structure 202 comprises a single-hetero structure.

On the substrate 301, a P-type GaAs or AlGaAs layer 2027 is formed in contact with the layer 310 of the substrate 301. An N-type AlGaAs layer 2028 is stacked on the layer 2027 to constitute a light emitting PN-junction between the layers 2027 and 2028. The forbidden band of the layer 2028 is wider than that of the layer 2027. On the layer 2028 is formed an N-type GaAs electrode contact layer 2029 on which an electrode 203 is disposed.

The arrangement of the semiconductor plate 300, the layer 310 and the layer 2027 is substantially the same as that of the plate 300, the layer 310 and the layer 2021 of FIG. 3b or that in which the conductivity type is reversed. The conductivity type and the layer structure of the layers 2028 and 2029 are determined according to the relation between the plate 300, the layer 310 and the layer 2027.

The substrate may be constructed as the structure of FIGS. 1 or 3a in which the current passing semiconductor layer is not provided.

FIG. 5 illustrates a still another embodiment of the semiconductor light emitting element in accordance with the present invention.

In the element of FIG. 5, the substrate 302 ia constituted from an N-type GaAs semiconductor plate 300, a P-type GaAs or AlGaAs current control layer 311 formed on the layer 300 and an N-type clad layer 312.

On the clad layer 312, a GaAs or AlGaAs active layer 2022, a P-type AlGaAs clad layer 2023 and a P-type GaAs electrode contact layer 2024 are stacked in this order. On the layer 2024 is formed a first electrode 203.

On the clad layer 312 is also formed a second electrode 206.

A feature of the structure of FIG. 5 resides in that the upper layer 312 of the substrate 302 is used on the one hand as the current passing semiconductor layer while on the other hand as one of the clad layers of the double-hetero structure of the multi-layered construction.

A current is applied from the electrode 203. The current passes through the layer 2024 and the layer 2023 to the active layer 2022 which generates light by recombination of carriers and further passes through the layer 312 to the electrode 206.

In the event that a P-type GaAs plate 300 is used, the conductivity type of each semiconductor layer is reversed from that of the structure mentioned above.

In order to achieve a reliable contact between the electrode 206 and the clad layer 312 disposed below the electrode 206, a diffusion area 312A may be formed by diffusing Zn or Si according to the conductivity type of the layer 312 by a thermal diffusion process or an ion implantation process.

Figure 6:
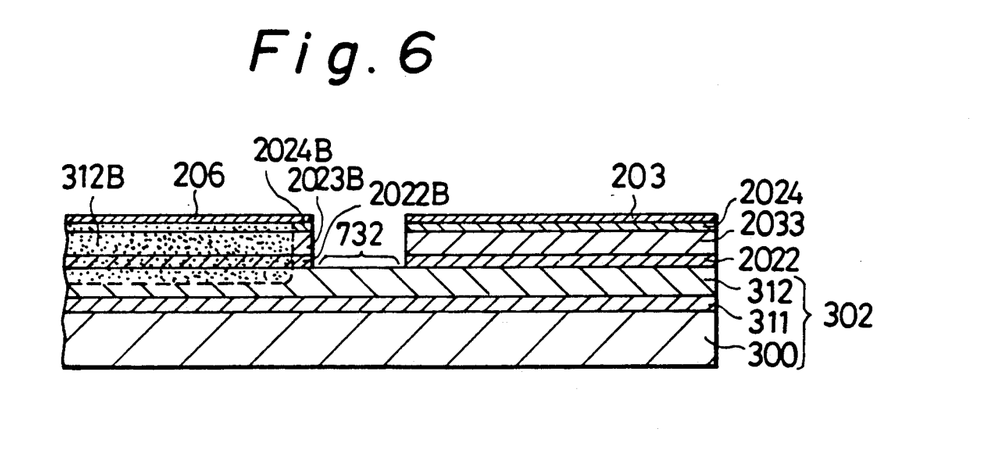
FIG. 6 is a sectional view of a further embodiment of the present invention.

FIG. 6 illustrates a variant of the structure of FIG. 5. The structure of FIG. 6 differs from the structure of FIG. 5 in that between the upper layer 312 of the substrate 302 and the electrode 206, a GaAs or AlGaAs layer 2022B, an AlGaAs layer 2023B and a GaAs layer 2024B are stacked in this order and impurities are diffused in the stacked area below the electrode 206 to form a diffusion area 312B to match the conductivity type of the layers 2022B, 2023B and 2024B with that of the clad layer 312. The impurities are diffused in the stacked layers by a thermal diffusion process or an ion implantation process. When the layer 312 is made from a P-type material, Zn, for instance, is diffused, while when the layer 312 is made from an N-type material, Si is diffused.

The semiconductor light emitting element of FIG. 6 is produced in such a way as described below.

First, a GaAs or AlGaAs active layer 2022, a P-type AlGaAs clad layer 2023 and a P-type GaAs layer 2024 are stacked over a sufficiently wide area on the substrate 302. After that, a groove 732 is formed to the depth reaching the surface of the layer 312 by a dry-etching process using a chlorine group gas or a wet-etching process. After that, the diffusion area 312B is formed as mentioned before in the area where the electrode 206 is to be formed. After that, the electrodes 203 and 206 are formed on the stacked structure.

It is to be noted that the inside wall of the groove 732 may be formed inclined or as a mesa instead of being perpendicular to the substrate surface. Also, the groove 732 may be buried with a silicon oxide material, a silicon nitride material or a resin material such as polyimide so that the wiring process can be easily conducted by flattening the element surface.

It is also to be noted that a current passing semiconductor layer may be disposed instead of the current control layer 311 and that the diffusion area 312B may be formed reaching the current passing semiconductor layer. In that case, the groove 732 may be formed reaching the current passing semiconductor layer.

A semiconductor light emitting element array can be realized by assembling a plurality of the above mentioned light emitting elements in a monolithic array arrangement. In the event that the elements comprise the substrate which has the current passing semiconductor layer formed on the upper surface thereof, as the embodiment of FIG. 2, 3b to 3e, 4, 5 or 6, it becomes possible to reliably separate the light emitting segments electrically by forming an insulation area in the current passing layer between the segments.

Examples of the semiconductor light emitting element array having a matrix wiring structure are described below.

Figure 7A:
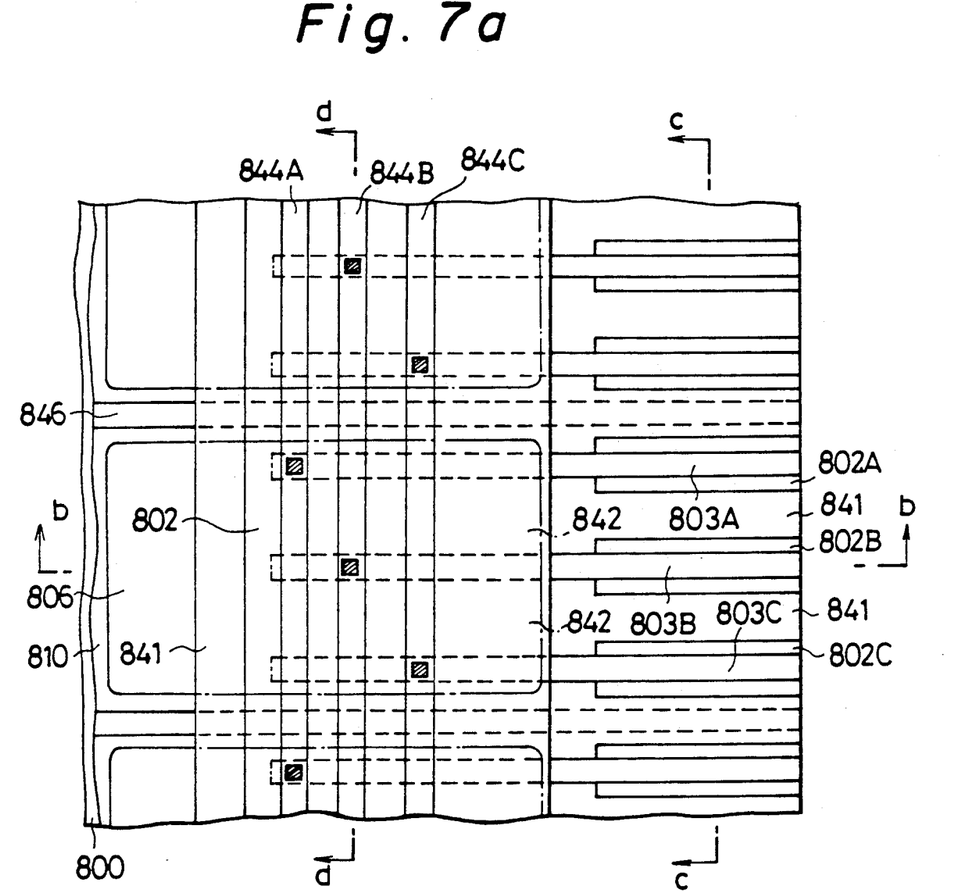
FIG. 7a is a partial plan view of a semiconductor light emitting element array structure in accordance with an embodiment of the present invention.

FIG. 7a is a plan view of an example of the array structure composed of the semiconductor light emitting elements in accordance with the present invention. The light emitting segments of the array are arranged in the vertical direction (upward and downward direction) in the drawing sheet. Every three segments constitutes one light emitting group.

Figure 7B:
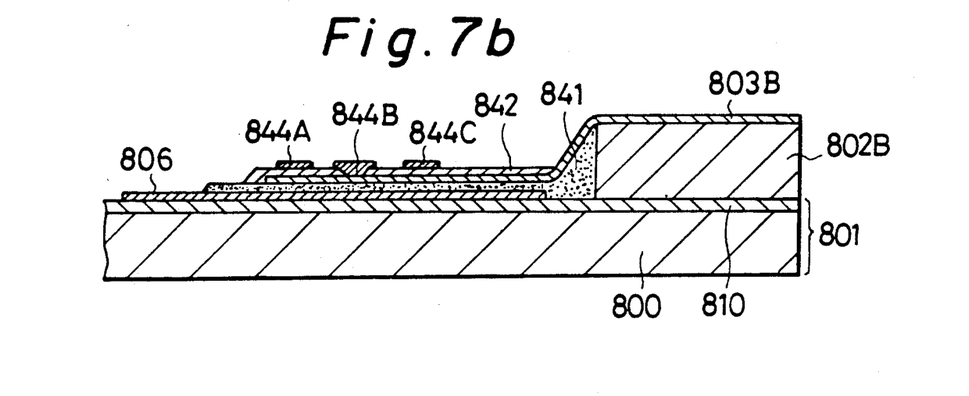

Referring to FIG. 7b which illustrates a sectional view of the array structure along the line b—b of FIG. 7a, the substrate 801 comprises a semiconductor plate 800 and a current passing semiconductor layer 810 formed on the plate 800. The substrate 801 is arranged in common for all of the light emitting segments.

A first electrode 803B is formed on a multi-layered semiconductor stacked structure 802B which constitutes a light emitting segment. A second electrode 806 is formed on the substrate 801.

A first insulation layer 841 made from silicon oxide or silicon nitride is formed in the side opposite to the light emitting end surface of the stacked structure 802B extending to and over the surface of the electrode 806 to reduce the step between the substrate surface and the electrode surface.

The electrode 803B is formed extending to and over the insulation layer 841 over the electrode 806. On the extending portion of the electrode 803B above the electrode 806, a further insulation layer 842 made from silicon oxide or silicon nitride is formed.

Referring back to FIG. 7a, the array arrangement of the light emitting segments are grouped by every three segments. The group comprises, as illustrated in FIG. 7a, three semiconductor multi-layered structures 802A, 802B and 802C, each constituting one light emitting segment. Each of the structures 802A, 802B and 802C has an individual first electrode 803A, 803B, 803C, respectively. The second electrode (counter electrode) 806 is arranged in common for the three electrodes 803A, 803B and 803C.

The groups each including three segments are electrically isolated from each other by a separation groove 846 which is formed in the layer 810 of the substrate 801 reaching the plate 800. The array comprises a plurality of the groups arranged in the vertical direction in FIG. 7a.

Figure 7C:
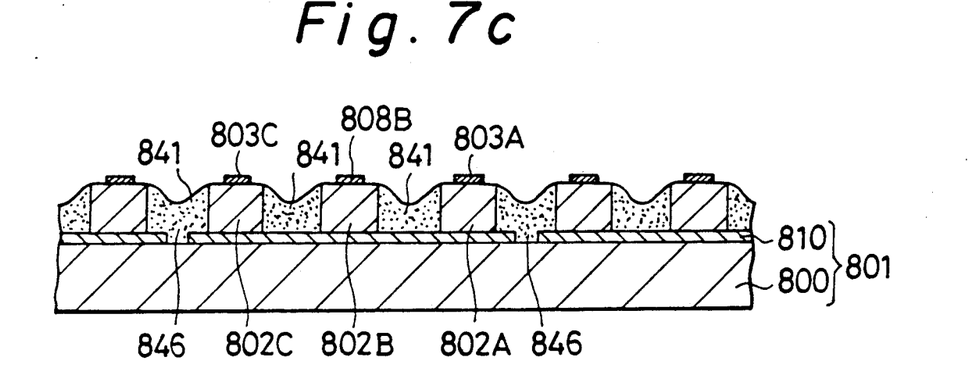

The insulation layer 841 fills the spaces between the structures 802A, 802B and 802C, as illustrated in FIG. 7c, so that the structures 802A, 802B and 802C are electrically separated from each other reliably.

Figure 7D:
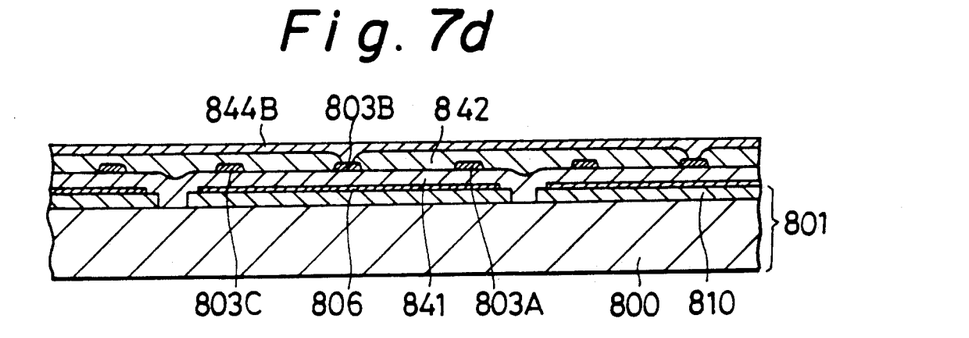

On the insulation layer 842, strip shaped electrodes 844A, 844B and 844C are formed in parallel to each other in the vertical direction in FIG. 7a. As can be seen from FIGS. 7b and 7d, the electrode 803B is connected to the electrode 844B through a hole formed in the insulation layer 842. Similarly, the other two electrodes 844A and 844C in each group are electrically connected to the electrodes 803A and 803C, respectively.

In accordance with such an arrangement, it becomes possible that one desired group is selected by selectively applying current to the electrode 806 commonly formed for the group and that one desired light emitting segment in the selected group is energized to emit light by selectively applying current to one of the electrodes 844A, 844B and 844C.

Figure 8A:
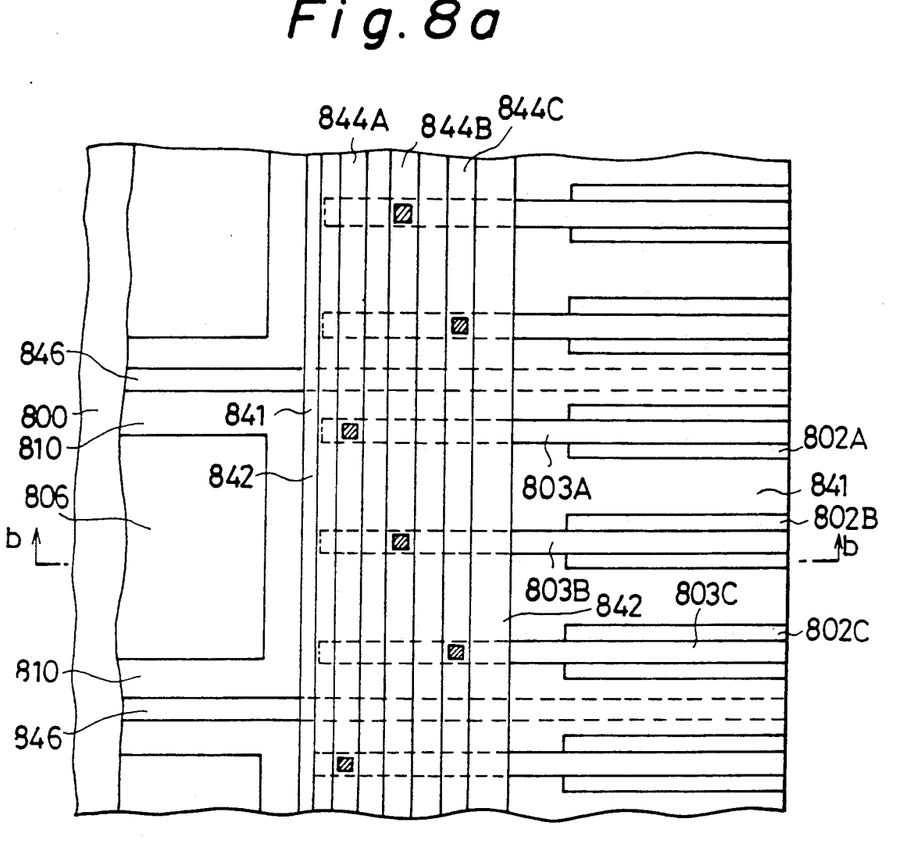
FIG. 8a is a plan view of a semiconductor light emitting element array structure in accordance with another embodiment of the present invention.
Figure 8B:
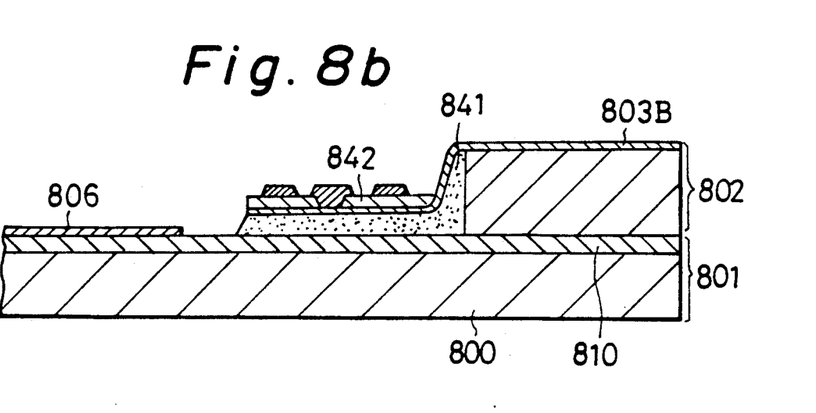

FIGS. 8a and 8b illustrate a variant of the array structure of FIGS. 7a to 7d. The corresponding parts of the variant structure are designated by the same numerals as those of FIGS. 7a to 7d.

The structure of FIGS. 8a and 8b differs from the structure of FIGS. 7a to 7d in that each of the electrodes 803A, 803B and 803C in each group does not overlap the common electrode 806 in the group through the insulation layer 841.

A desired light emitting segment of all the segments arranged in the array can be selected in the same way as the structure of FIGS. 7a to 7d mentioned above. That is, one desired group is selected by selectively applying current to the common electrode 806 of the group and one desired segment is energized by selectively applying current to one of the electrodes 844A, 844B and 844C.

Due to the arrangement wherein the first and second electrodes do not overlap each other, the area where the electrodes 844A, 844B and 844C are to be formed is maintained relatively flat in comparison to the structure of FIGS. 7a to 7d in which the first electrodes are overlappingly formed above the second electrode through the insulation layer. This makes it easier to form the electrodes 844A, 844B and 844C on the insulation layer 842.

Figure 9:
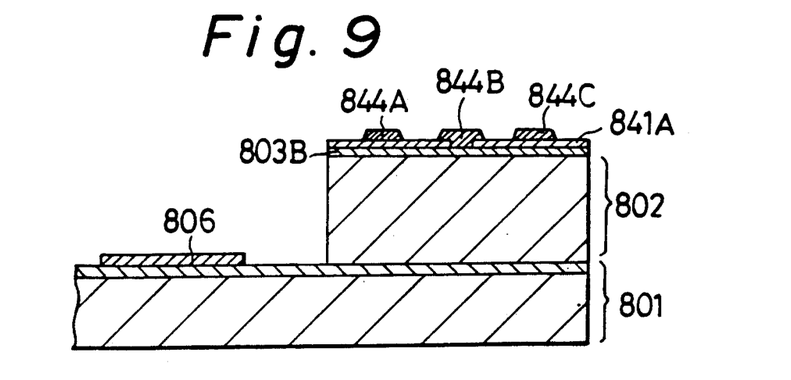
FIG. 9 is a sectional view of still another embodiment of the array structure in accordance with the present invention.

FIG. 9 illustrates still another embodiment of the array structure constituted from the light emitting elements in accordance with the present invention.

In the array structure of FIG. 9, the matrix wiring arrangement is formed on the multi-layered stacked structure 802 instead of being formed in the area near the stacked structure 802 by extending the wiring from the upper layer of the stacked structure to the area aside the layered stack.

As the structure of FIGS. 7 and 8, also in the structure of FIG. 9, one stacked structure constitues one light emitting segment and three segments constitute one group having one common electrode. A number of segments 802 are disposed in the direction perpendicular to the drawing sheet. An electrically insulation layer 841A is commonly formed on the stacked structures 802. On the insulation layer 841A, longitudinal strip shaped electrodes 844A, 844B and 844C are formed in parallel to each other extending in the direction perpendicular to the drawing sheet. The electrodes 844A, 844B and 844C forms a matrix wiring arrangement in conjunction with the first electrode formed on each of the layered stacks 802 in the manner similar to that of the structure of FIGS. 7 and 8.

The number of the strip shaped longitudinal electrodes is not limited to three and may be different from the number of the first electrodes included in one group. Also, the intersection angle between each strip electrode and each first electrode is not limited to 90 degrees. The electrodes may intersect at a predetermined constant angle instead of intersecting perpendicularly.

The array structure of any of FIGS. 7 to 9 can be realized using any of the light emitting elements mentioned before.

By adopting the above-mentioned matrix wiring arrangement, it becomes possible to actuate each of the light emitting elements with the use of small number of lead wires less than the number of the electrodes of the light emitting segments. Accordingly, the light emitting segments can be arranged at a very high density without lowering the throughput due to the wiring process and reducing the functional reliability of the light emitting array.

As mentioned above, in accordance with the present invention, it becomes possible to realize a novel structure of the semiconductor light emitting element and a novel array using the light emitting elements of the present invention.

Also, as mentioned above, due to the arrangement in which the power supplying electrode and the counter electrode are both disposed on the same upper surface side of the substrate, in the event that the elements of the invention are to be used to constitute an array structure, the electrodes can be easily patterned and the array can be connected to various kinds of electronic devices.

It is to be noted that the semiconductor material used in the element is not limited to GaAs group material or AlGaAs group material as the embodiments mentioned above but any compound semiconductor materials such as InP, InGaAsP, InGaAlP, GaAlP, GaP, ZnS, ZnSe and PbSnSe can be used in the light emitting element of the present invention.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor light emitting array comprising:
   a common substrate;
   a current passing semiconductor layer, formed on said substrate, through which electric current is allowed to flow;
   a plurality of light emitting segments formed on said current passing layer and arranged in an array, each of said light emitting segments being adapted to emit light when voltage is applied thereacross, a predetermined number of successive light emitting segments defining a light emitting group;
   a plurality of electrically isolating means disposed in said current passing layer for dividing said current passing layer into a plurality of divided areas, each of said divided areas containing one of said light emitting groups, and for electrically isolating said light emitting groups from one another;
   a first electrode formed on at least an upper surface of each of said light emitting segments;
   a second electrode formed on said current passing layer in each divided area for a corresponding one of said light emitting groups; and
   said predetermined number of strip shaped parallel selection electrodes formed in parallel with an arranging direction of said light emitting elements, each of said selection electrodes being electrically connected to a respective one of said light emitting elements in each of said light emitting groups through a corresponding one of said first electrodes for selectively supplying current to said respective one of said light emitting elements in association with a corresponding one of said second electrodes for each light emitting group.

2. A semiconductor light emitting array according to claim 1, wherein said isolating means comprises an insulation area dividing said current passing layer and reaching to said common substrate.

3. A semiconductor light emitting array according to claim 1, wherein said isolating means comprises a separation groove dividing said current passing layer and reaching to said common substrate.

4. A semiconductor light emitting array according to claim 1, wherein said current passing layer is made from an n-type material while the common substrate is made from a p-type material, a third electrode is formed on one of a lower surface of said common substrate and an area on an exposed upper surface of said common substrate, and a potential applied to said third electrode is lower than that applied to said second electrode.

5. A semiconductor light emitting array according to claim 1, wherein said current passing layer is made from a p-type material while the common substrate is made from n-type material, a third electrode is formed on one of a lower surface of said common substrate and an area on an exposed upper surface of said common substrate, and a potential applied to the third electrode is higher than that applied to said second electrode.

6. A semiconductor light emitting array according to claim 1, wherein said common substrate is made from an n-type material while the current passing layer comprises a p-type layer on said common substrate and an n-type layer on said p-type layer, a third electrode is formed on one of a lower surface of said common substrate and an area on an exposed upper surface of said common substrate, and a potential applied to the third electrode is higher than that applied to said second electrode.

7. A semiconductor light emitting array according to claim 1, wherein said common substrate is made of p-type material while the current passing layer comprises an n-type layer on said common substrate and a p-type layer on said n-type layer, a third electrode is formed on one of a lower surface of said common substrate and an area on an exposed upper surface of said common substrate, and a potential of the third electrode is arranged to be lower than that of said second electrode.

8. A semiconductor light emitting array according to claim 1, wherein each of said first electrodes has an extending portion being disposed on an insulating layer which is formed on a respective one of said second electrodes and extending in a direction perpendicular to said arranging direction, and said selection electrodes are disposed near said light emitting elements and on another insulating layer overlying said extending portions of said first electrodes.

9. A semiconductor light emitting array according to claim 1, wherein each of said first electrodes has an extending portion being disposed on an insulating layer which is formed on said current passing layer and extending in a direction perpendicular to said arranging direction, and said selection electrodes are disposed near said light emitting elements and on another insulating layer overlying said extending portions of said first electrodes.

10. A semiconductor light emitting array according to claim 1, wherein each of said first electrodes is disposed on only said upper surface of each of said light emitting elements, and said selection electrodes are disposed on insulating layers formed respectively on said first electrodes.

11. A semiconductor light emitting array according to claim 8, 9 or 10, wherein said isolating means comprises an insulation area dividing said current passing layer and reaching to said common substrate.

12. A semiconductor light emitting array according to claim 8, 9 or 10, wherein said isolating means comprises a separation groove dividing said current passing layer and reaching to said common substrate.

13. A semiconductor light emitting array according to claim 8, 9 or 10, wherein said current passing layer is made from a resistive n-type material while the common substrate is made from a p-type material, a third electrode is formed on one of a lower surface of said common substrate and an area on an exposed upper surface of said common substrate, and a potential applied to said third electrode is lower than that applied to said second electrode.

14. A semiconductor light emitting array according to claim 8, 9 or 10, wherein said current passing layer is made from a resistive p-type material while the common substrate is made from n-type material, a third electrode is formed on one of a lower surface of said common substrate and an area on an exposed upper surface of said common substrate, and a potential applied to the third electrode is higher than that applied to said second electrode.

15. A semiconductor light emitting array according to claim 8, 9 or 10, wherein said common substrate is made of n-type material while the current passing layer comprises a p-type layer on said common substrate and an n-type layer on said p-type layer, a third electrode is formed on one of a lower surface of said common substrate and an area on an exposed upper surface of said common substrate, and a potential applied to the third electrode is higher than that applied to said second electrode.

16. A semiconductor light emitting array according to claim 8, 9 or 10, wherein said common substrate is made of p-type material while the current passing layer comprises an n-type layer on said common substrate and a p-type layer on said n-type layer, a third electrode is formed on one of a lower surface of said common substrate and an area on an exposed upper surface of said common substrate, and a potential applied to the third electrode is lower than that applied to said second electrode.

* * * * *

UNITED STATES PATENT AND TRADEMARK OFFICE
CERTIFICATE OF CORRECTION

PATENT NO. : 5,093,697
DATED : March 3, 1992
INVENTOR(S) : Shiro Satoh

It is certified that error appears in the above-identified patent and that said Letters Patent is hereby corrected as shown below:

```
On the title page, Item [73]:
  The assignee is incorrect, should be, -- Ricoh Company, Ltd.,
Tokyo; Ricoh Research Institute of General Electronics Co.,
Ltd., Natori, both of Japan--.
```

Signed and Sealed this

Twelfth Day of July, 1994

Attest:

BRUCE LEHMAN

*Attesting Officer*  Commissioner of Patents and Trademarks